US009490210B2

(12) United States Patent
Hong

(10) Patent No.: US 9,490,210 B2
(45) Date of Patent: Nov. 8, 2016

(54) ELECTRICAL INTERCONNECTION STRUCTURE AND FABRICATION METHOD THEREOF

(71) Applicant: Semiconductor Manufacturing International (Shanghai) Corporation, Shanghai (CN)

(72) Inventor: Zhongshan Hong, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 2 days.

(21) Appl. No.: 14/657,465

(22) Filed: Mar. 13, 2015

(65) Prior Publication Data

US 2015/0279785 A1 Oct. 1, 2015

(30) Foreign Application Priority Data

Mar. 25, 2014 (CN) .......................... 2014 1 0113767

(51) Int. Cl.

*H01L 23/52* (2006.01)
*H01L 23/532* (2006.01)
*H01L 21/02* (2006.01)
*H01L 21/027* (2006.01)
*H01L 21/3213* (2006.01)
*H01L 21/768* (2006.01)
*H01L 23/522* (2006.01)
*H01L 23/528* (2006.01)

(52) U.S. Cl.

CPC ..... *H01L 23/53238* (2013.01); *H01L 21/0214* (2013.01); *H01L 21/0276* (2013.01); *H01L 21/02164* (2013.01); *H01L 21/32135* (2013.01); *H01L 21/32139* (2013.01); *H01L 21/76831* (2013.01); *H01L 21/76846* (2013.01); *H01L 21/76852* (2013.01); *H01L 21/76864* (2013.01); *H01L 21/76877* (2013.01); *H01L 21/76885* (2013.01); *H01L 21/76897* (2013.01); *H01L 23/528* (2013.01); *H01L 23/5222* (2013.01); *H01L 23/5226* (2013.01); *H01L 23/53295* (2013.01); *H01L 21/7682* (2013.01); *H01L 23/5329* (2013.01); *H01L 2221/1078* (2013.01); *H01L 2924/0002* (2013.01)

(58) Field of Classification Search

None

See application file for complete search history.

(56) References Cited

U.S. PATENT DOCUMENTS 6,066,569 A * 5/2000 Tobben ............. H01L 21/31144 257/E21.257
6,242,349 B1 * 6/2001 Nogami ............ H01L 21/76843 205/184
6,285,082 B1 * 9/2001 Joshi ................. H01L 21/76805 257/750
6,352,917 B1 * 3/2002 Gupta ............... H01L 21/76801 257/E21.576
2005/0272258 A1 * 12/2005 Morita ................ H01L 21/2855 438/660
2008/0142972 A1 * 6/2008 Redeker .............. C23C 18/1653 257/751

* cited by examiner

*Primary Examiner* — Benjamin Sandvik
*Assistant Examiner* — Herve Assouman
(74) *Attorney, Agent, or Firm* — Anova Law Group, PLLC

(57) ABSTRACT

An interconnection structure fabrication method is provided. The method includes providing a substrate; forming a conductive film with a first thickness and having a first lattice structure and a first grain size, wherein the first thickness is greater than the first grain size; and performing an annealing process to change the first lattice structure of the conductive film to a second lattice structure and to change the first grain size to a second grain size. The second grain size is greater than the first grain size, and the first thickness is greater than or equal to the second grain size. The method also includes etching portion of the conductive film to form at least one conductive layer; etching portion of the conductive layer to form at least one trench having a depth smaller than the first thickness in the conductive layer to form an electrical interconnection wire and conductive vias; and forming a dielectric layer covering the substrate, sidewalls of the conductive layer, and the trench.

18 Claims, 5 Drawing Sheets

203a
207
206
205a
205
203b
205b
202a
211
212
200
210

ELECTRICAL INTERCONNECTION STRUCTURE AND FABRICATION METHOD THEREOF

CROSS-REFERENCES TO RELATED APPLICATIONS

This application claims the priority of Chinese patent application no. CN201410113767.5, filed on Mar. 25, 2014, the entire content of which is incorporated herein by reference.

FIELD OF THE DISCLOSURE

The present disclosure relates to the field of semiconductor manufacturing technology and, more particularly, relates to electrical interconnection structures and fabrication methods thereof.

BACKGROUND

In the field of the semiconductor manufacturing, to electrically connect semiconductor devices, many types of metal interconnection structures and interconnection structure fabrication methods are developed, such as the copper interconnection structure and the electro-coppering plating method. However, as the development of the ultra-large scale integration (ULSI), characteristic dimension (CD) of the semiconductor devices continues shrinking. Thus, the methods for forming the metal interconnection structures are challenged.

FIG. 1 illustrates a sectional view of an exemplary conventional copper interconnection structure. As shown in FIG. 1, the process for forming the copper interconnection structure includes providing a substrate 100 having a first dielectric layer 101 and an exposed conductive layer 102 in the first dielectric layer 101; forming a second dielectric layer 103 on the first dielectric 101 and the conductive layer 102; forming openings in the second dielectric layer 103 to exposed the conductive layer 102, wherein the openings further include first sub-openings located on the top of the conductive layer 102, and second sub-openings located on top of the first sub-opening. That is, the first sub-openings and the second sub-openings form through openings. The size of the top end of the second sub-opening is larger than that of the first sub-opening. And, one or more the first sub-openings are formed at the bottom of the second sub-opening.

Further, a seed layer is formed on the surface of the second dielectric layer 103, and the sidewalls and the bottom surface of the openings. The seed layer is made of a conductive material. A copper material layer is formed on the surface of the seed layer using an electroplating process to fill the openings; and a copper interconnection structure 105 is formed by etching and removing portion of the copper material layer located on the second dielectric layer 103. In addition, the copper material layer located on the second dielectric layer 103 can also be removed by a chemical mechanical planarization process.

However, the current copper interconnection structure may have poor electrical performance. The disclosed methods are directed to solve one or more problems set forth above and other problems.

BRIEF SUMMARY OF THE DISCLOSURE

One aspect of the present disclosure provides an interconnection structure fabrication method. The method includes providing a substrate; forming a conductive film with a first thickness and having a first lattice structure and a first grain size, wherein the first thickness is greater than the first grain size; and performing an annealing process to change the first lattice structure of the conductive film to a second lattice structure and to change the first grain size to a second grain size. The second grain size is greater than the first grain size, and the first thickness is greater than or equal to the second grain size. The method also includes etching portion of the conductive film to form at least one conductive layer; etching portion of the conductive layer to form at least one trench having a depth smaller than the first thickness in the conductive layer to form an electrical interconnection wire and conductive vias; and forming a dielectric layer covering the substrate, sidewalls of the conductive layer, and the trench.

Another aspect of the present disclosure provides an interconnection structure formed using the disclosed electrical interconnection structure fabrication method. The interconnection structure includes a substrate; a conductive layer formed from a conductive film on the substrate using an annealing process, wherein the conductive film has a first thickness, a first lattice structure, and a first grain size; the first thickness is greater than the first grain size; the conductive layer has a second lattice structure and a second grain size; and the second grain size is greater than the first grain size and the first thickness is greater than or equal to the second grain size; at least one trench having a depth smaller than the first thickness formed in the conductive layer, wherein portions of the conductive layer located in the trench sidewalls form conductive vias, and portion of the conductive layer located under the conductive vias and at a bottom of the trench forms an electrical interconnection wire; and a dielectric layer covering the substrate, sidewalls of the conductive layer, and the trench.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

As illustrated in the background section, the conventional copper interconnection structure may have poor electrical performance.

Figure 1:
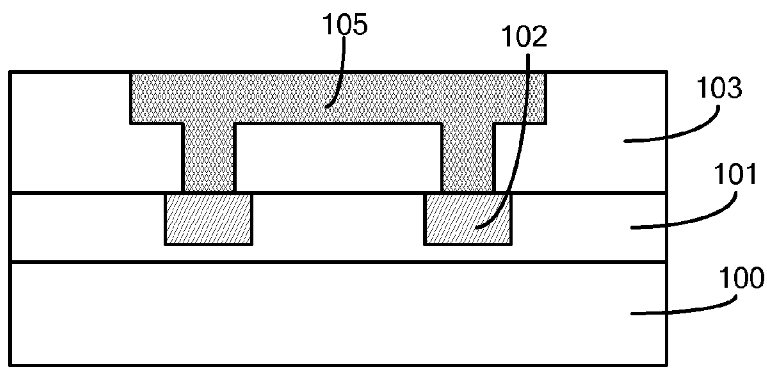
FIG. 1 illustrates a sectional view of a conventional copper interconnection structure.

Metal materials in general have polycrystalline lattice structures. In addition, the larger the grain size of an individual complete lattice structure is, the lower the resistance of the metal material may be. Thus, to lower the resistance of the copper interconnection structure 105 (FIG. 1), the copper interconnection structure may be made of the copper material having large grain size. When forming the copper interconnection structure as shown in FIG. 1, one way to increase the copper lattice grain size is using an annealing process. More specifically, the annealing process may be performed after forming the copper material layer. During the annealing process, the copper grains may grow up, and may form a new lattice structure. The new lattice structure may have enlarged grain size.

However, as the integration level of the semiconductor devices is increasing, the size of the semiconductor devices is shirking. Thus, the size of the openings for forming the copper material layer may become smaller. And, the copper material layer formed in the openings may become thinner. Because the copper material layer may be relatively thin, during the thermal annealing process, the copper grain growth may be suppressed. Thus, after the annealing process, the increment in the copper grain size may be limited, and the decrease in the resistance of the copper interconnection structure 105 may also be limited.

To solve the above problems, the present disclosure provides an electrical interconnection structure fabrication method. In this method, a conductive film having a first lattice structure and a first thickness may be formed on a substrate. The first lattice structure may have a first grain size smaller than the first thickness. Thus, gains of the material in the conductive film may have enough room to grow up. After the thermal annealing process, the lattice structure of the conductive film may be rearranged and may form a second lattice structure. The second lattice structure may have a second grain size, and the second grain size may be larger than the first grain size. Thus, the formed conductive film may have lowered resistance. Conductive vias and electrical interconnection wires formed using the conductive film may have desired electrical performance.

Further, a conductive layer may be formed by etching the conductive film, and trenches may be formed in the conductive layer. Portion of the conductive layer located in the trench sidewalls may form conductive vias, and portion of the conductive layer located under the conductive vias and at the bottom of the trenches may form electrical interconnection wires. That is, the conductive vias and the electrical interconnection wires may be formed using the conductive film. Thus, processes for forming the conductive vias and the electric interconnection wires may be performed at the same time, simplifying the electrical interconnection structure fabrication process.

Moreover, the conductive film may be used to form the electric interconnection wires and the conductive vias located on the electrical interconnection wires. The sum of the height of the conductive vias and the thickness of electrical interconnection wires may be relatively large. Thus, even if the first thickness of the conductive film is relative large, the conductive film does not need to be thinned significantly prior forming the conductive layer. The process for forming the electrical interconnection structure may be easily performed, and the formed electrical interconnection structure may have desired morphology.

Figure 9:
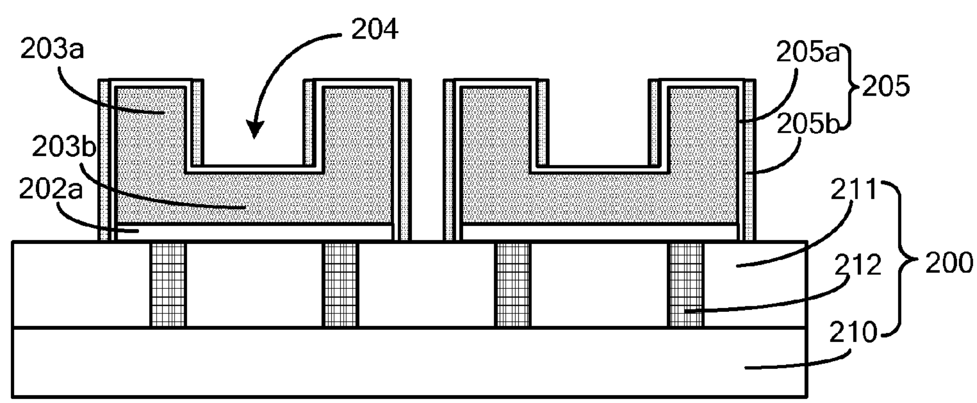
Figure 10:
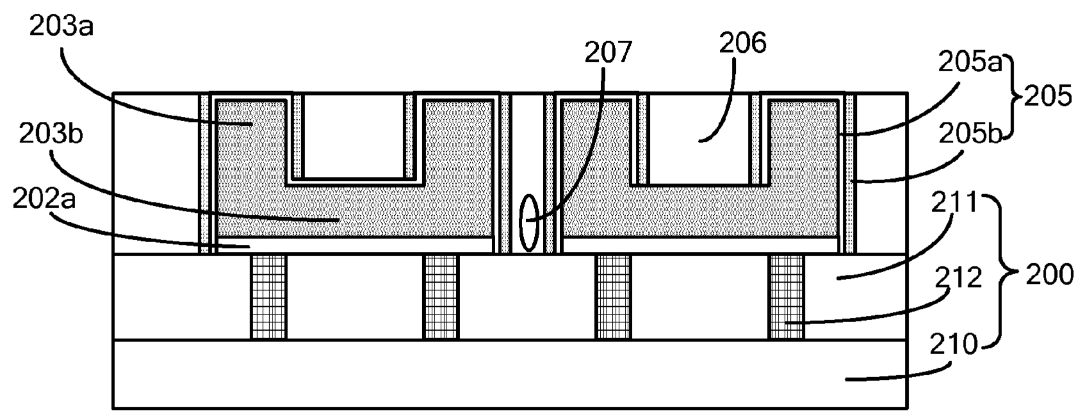
Figure 11:
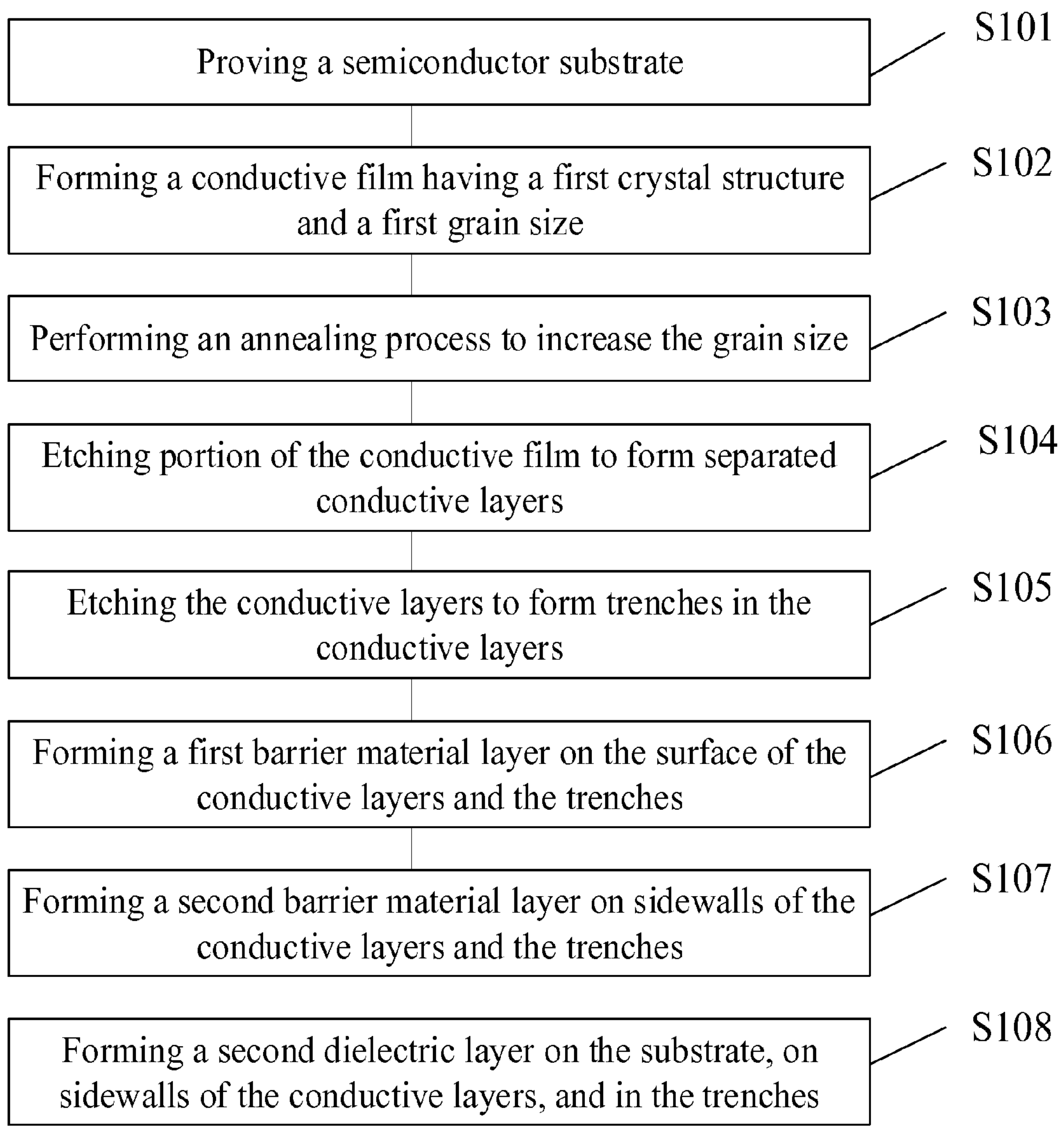
FIG. 11 illustrates a flow chart of an exemplary electrical interconnection fabrication method consistent with the disclosed embodiments.

An exemplary electrical interconnection structure fabrication method is illustrated in detail below. FIGS. 2-10 illustrate sectional views of an exemplary electrical interconnection structure corresponding to certain stages of the fabrication process consistent with the disclosed embodiments. FIG. 11 illustrates a flow chart of an exemplary electrical interconnection structure fabrication method consistent with the disclosed embodiments.

Figure 2:
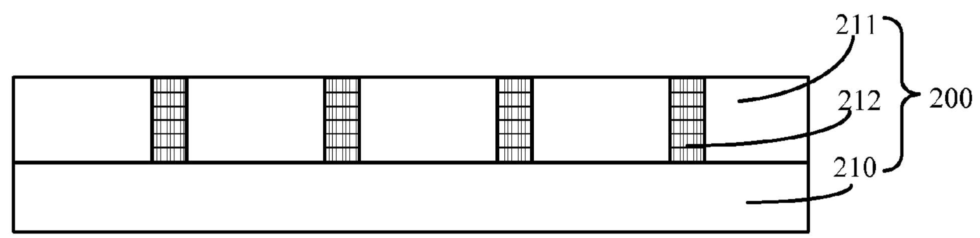
FIGS. 2-10 illustrate sectional views of an exemplary electrical interconnection structure corresponding to certain stages of a fabrication process consistent with the disclosed embodiments.

As shown in FIG. 11, at the beginning of the fabrication process, a substrate is provided (S101). FIG. 2 illustrates a sectional view of an exemplary electrical interconnection structure corresponding to certain stages of the fabrication process consistent with the disclosed embodiments.

As shown in FIG. 2, a substrate 200 is provided. The substrate 200 may include a semiconductor substrate 210, a first dielectric layer 211 located on the semiconductor substrate 210, and one or more conductive structures 212 located in the first dielectric layer 211. In addition, the top surface of the conductive structures 212 is flush with the surface of the first dielectric layer 211

Further, the semiconductor substrate 210 may be made of any appropriate semiconductor materials, such as silicon, germanium, silicon carbide, silicon germanium, lead telluride, etc. The semiconductor substrate 210 may also be made of any appropriate composite materials, such as silicon on insulator (SOI), germanium on insulator (GOI), etc. The semiconductor substrate 210 may also be made of group III-V compounds, such as, gallium nitride, indium antimonide, indium arsenide, indium phosphide, etc. Further, the semiconductor substrate 210 may also be made of any appropriate dielectric materials or insulation materials, such as silicon oxide, silicon nitride, silicon oxynitride, silicon carbonitride, etc.

Moreover, the semiconductor substrate 210 may have certain semiconductor devices formed on the surface. The conductive structures 212 may be used to electrically connect the semiconductor devices, forming a semiconductor device circuit. The first dielectric layer 211 may be used to electrically insulate the semiconductor devices and the conductive structures 212.

Figure 3:
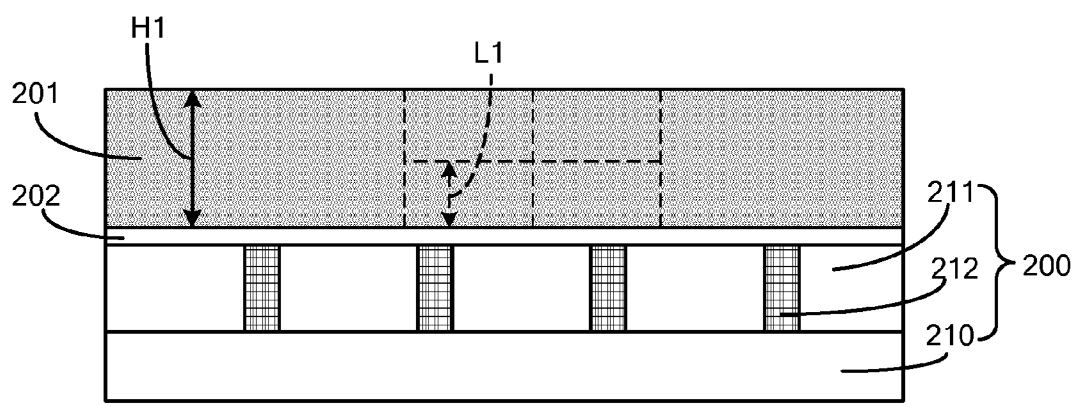

The conductive structures 212 may be formed by electrical interconnection wires parallel to the substrate surface, conductive vias perpendicular to the substrate surface, or a combination thereof. The substrate 200 may have at least one conductive structure 212. In one embodiment, the substrate may have 4 separated conductive structures 212 as shown in FIG. 3. The conductive structures 212 exposed on the surface of the substrate 200 may be conductive vias. Electrical interconnection wires formed subsequently may connect certain the conductive structures 212 together. Then, the connected conductive structures 212 may be connected to other electrical circuits by certain conductive vias formed later on the surface of the electrical interconnection wires. The conductive structures 212 may be made of copper. In other embodiments, the conductive structure 212 may be made of other proper conductive materials, such as tungsten, aluminum, etc.

In certain other embodiments, the substrate may be a semiconductor substrate having conductive structures formed in the semiconductor substrate. The surface of the conductive structures may be in flush with the surface of the semiconductor substrate. The conductive structures may be conductive vias. That is, the conductive structures may be through the silicon vias (TSVs).

Further, the first dielectric layer 211 may be made of $SiO_2$, SiN, SiON, SiCOH, or certain low k materials (e.g. porous dielectric materials). When the first dielectric layer 211 is made of the low k materials, the first dielectric layer 211 may have better electrical insulation performance. In addition problems such as parasitic capacitance or leakage current may be avoided. Certain gaps may be formed in the first dielectric layer 211 between the adjacent conductive structures 212. The gaps may further enhance the electrical insulation performance of the first dielectric layer 211 to better insulate the adjacent conductive structures 212.

Returning to FIG. 11, a conductive film having a first lattice structure and a first grain size is formed on the substrate (S102). FIG. 3 illustrates sectional view of an exemplary electrical interconnection structure corresponding to certain stages of the fabrication process consistent with the disclosed embodiments.

As shown in FIG. 3, a conductive film 201 is formed on the substrate 200. The material in the conductive film 201 may have a first lattice structure. The first lattice structure may have an averaged first grain size L1. The conductive film 201 may have a first thickness H1. In addition, the first thickness H1 may be larger than the first grain size L1.

In one embodiment, prior forming the conductive film 201, a first barrier film 202 may be formed on the surface of the substrate 200. Then, the conductive film 201 may be formed on the surface of the first barrier film 202. The first barrier film 202 may prevent the material in the conductive film 201 from diffusing into the first dielectric layer 211. In addition, the first barrier film 202 may serve as a seed layer for growing the conductive film 201 during a subsequent electroplating process. The first barrier film 202 may be made of tantalum, tantalum nitride, lanthanum, copper-manganese alloys, cobalt, or a combination thereof.

Further, the conductive film 201 may be made of copper. Because the copper has good electrical conductivity, electrical interconnection wires and conductive vias made of the copper material may have good performance and stability. The conductive film 201 may be formed by an electro-coppering plating (ECP) process. During the electro-coppering plating process, because the first barrier film 202 may be a conductive layer, the first barrier film 202 may be used as the seed layer. The conductive film 201 may be formed on the surface of the first barrier film 202.

Moreover, the first thickness H1 of the conductive film 201 may be larger than 2000 angstroms. The first thickness H1 of the conductive film 201 may be relatively thick, and is larger than the first grain size of the conductive film 201. Thus, during a subsequent annealing process, the material grains in the conducive film 201 may have enough room to grow up. After the annealing process, the grains of the material in the conductive film 201 may become significantly larger, and the grain growth may not be suppressed by a thin conductive film 201. The bigger the grain size of the material in the conductive film 201 is, the lower the resistant of the conductive film 201 may be. Thus, the electrical interconnection wires and conductive vias formed using the conductive film 201 may have better electrical performance.

Figure 4:
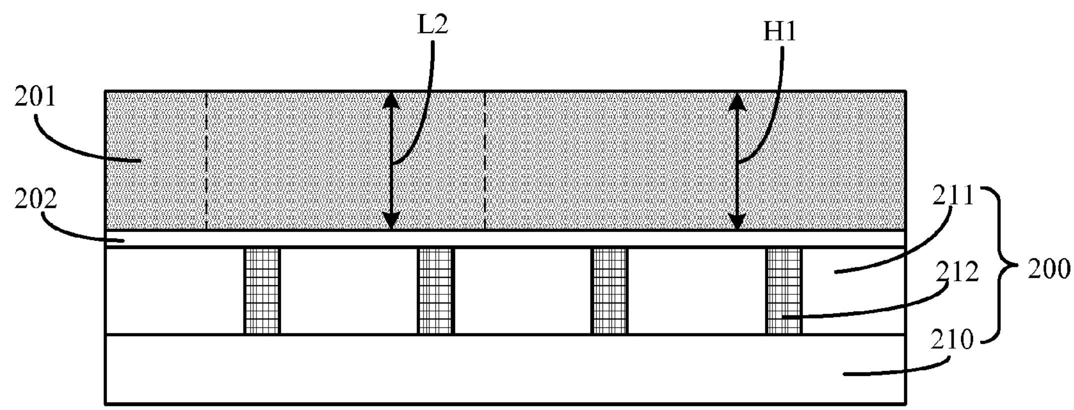

Returning to FIG. 11, an annealing process is performed to enlarge the first grain size to a second grain size (S103). FIG. 4 illustrates sectional view of an exemplary electrical interconnection structure corresponding to certain stages of the fabrication process consistent with the disclosed embodiments.

As shown in FIG. 4, an annealing process is performed to enlarge the grain size of the material in the conductive film 201. After the annealing process, the material in the conductive film 201 may have a second lattice structure and an averaged second grain size L2. The first thickness H1 may be larger than or equal to the second grain size L2.

More specifically, the annealing process may be performed at temperature ranging approximately from 200° C. to 450° C. The annealing process duration may range approximately from 5 minutes to 30 minutes.

In one embodiment, the conductive film 201 is made of copper. During the annealing process, the copper grains may grow up. The copper material lattice structure may be rearranged, forming a second lattice structure. The individual complete second lattice structure may have the enlarged second grain size. Thus, resistance of the conductive film 201 may be reduced. In addition, because the conductive film 201 may be relatively thick, the copper grain growth may not be suppressed. After the thermal annealing process, the gain size of the material in the conductive film 201 may be increased to the second grain size. The interconnection wires and conductive vias formed subsequently using the conductive film 201 may have significantly reduced resistance and enhanced performance.

After the annealing process, the second grain size L2 of the conductive film 201 may be still smaller than the first thickness H1 of the conductive film 201. That is, the conductive film 201 may have enough room for the material grains to grow up. The enlarged second grain size may be good for reducing the resistance of the conductive film 201.

In one embodiment, the second grain size L2 of the conductive film 201 is equal to the first thickness H1 of the conductive film 201. After subsequently etching the conductive film 201 to form a conductive layer, the formed conductive layer may be made of one copper grain. Thus, electrical interconnection wires and conductive vias formed using the conductive layer may have the best electrical conductivity.

In other embodiments, after the annealing process, a thinning process may be performed to reduce the thickness of the conductive film 201 to a second thickness. The second thickness may be the sum of the height and the thickness of the subsequently formed conductive vias and electrical interconnection wires. Thus, the conductive film 201 may not necessarily be thinned too much, simplifying the conductive film 201 thinning process, shortening the thinning process time, and reducing damages to the surface uniformity or morphology of the conductive film 201. After the thinning process, material in the conductive film 201 may still have the second lattice structure. That is, after the thinning process, the thickness of the conductive film 201 may be smaller than or equal to the second grain size L2, because the lattice structure of the material in the conductive film 201 may not be changed, the conductive film 201 may still have relatively low resistivity.

Figure 5:
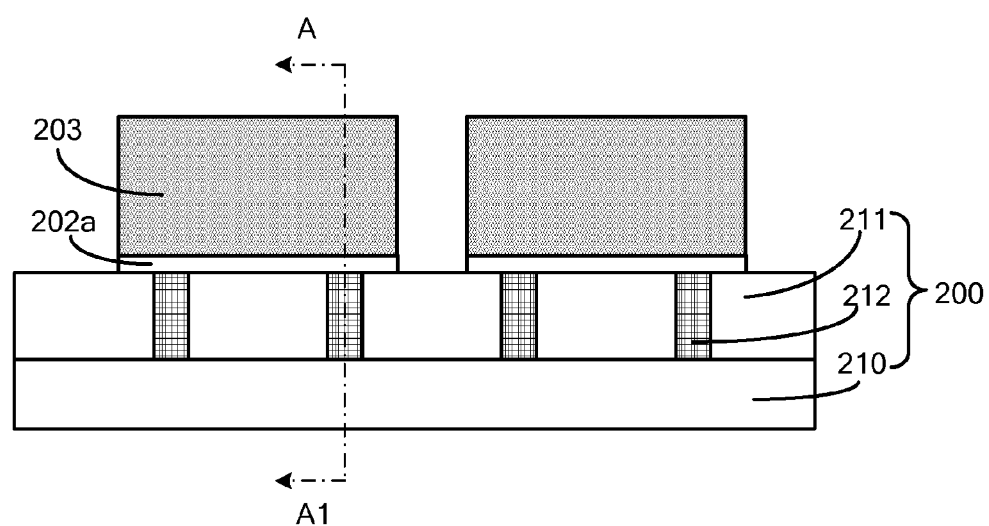
Figure 6:
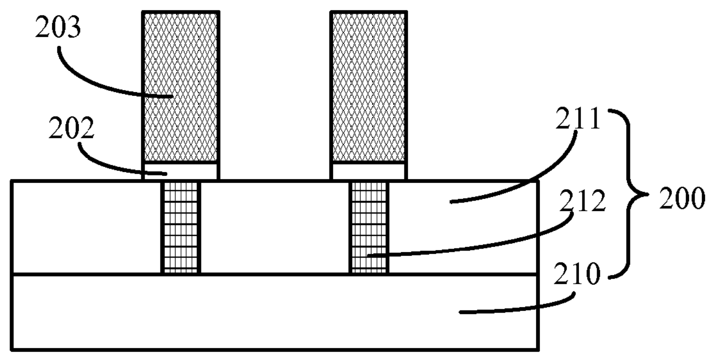

Returning to FIG. 11, separated conductive layers are formed by etching portion of the conductive film (S104). FIG. 5 illustrates sectional view of an exemplary electrical interconnection structure corresponding to certain stages of the fabrication process consistent with the disclosed embodiments. FIG. 6 illustrates A-A1 sectional view of FIG. 5.

As shown in FIGS. 5-6, portion of the conductive film 201 (FIG. 4) is etched until the surface of the substrate 200 is exposed, forming at least one conductive layer 203.

More specifically, by etching the conductive film 201, one or more separated conductive layers 203 may be formed on the substrate 200. Further, one conductive layer 203 may be used to form one electrical interconnection wire and one or more conductive vias on the surface of the electrical interconnection wire.

After the annealing process, the grain size of the material in the conductive film 201 may be increased to the second grain size. The first thickness of the conductive film 201 may be larger than or equal to the second grain size L2. The conductive layer 203 formed by the etching process may be made of one copper grain, and may be in low resistance. Thus, the electrical interconnection wire and conductive vias made by the conductive layer 203 may have significantly better performance. In one embodiment, the conductive layer 203 is formed by one copper grain, and the thickness of the conductive layer 203 is equal to the second grain size L2.

Further, to form the conductive layer 203, a first mask may be formed on the surface of the conductive film 201 first. The first mask may define patterns of the interconnection wires to be formed subsequently along the direction parallel to the surface of the substrate 200. Next, an anisotropic dry etching process may be performed to etch the conductive film 201 using the first mask as a mask. The etching process may be stopped after the surface of the substrate 200 is exposed, forming the conductive layer 203. Then, the first mask may be removed after forming the conductive layer 203.

Moreover, the first mask may include a first anti-reflection layer on the conductive film 201, a first mask layer on the first anti-reflection layer, and a first photoresist layer on the first mask layer.

In addition, the first photoresist layer may be formed by performing a spin coating process and an exposure process after the spin coating process. The first anti-reflection layer may be made of amorphous carbon or certain bottom anti-reflection materials. The first anti-reflection layer may prevent the defuse reelection of the exposure light at the surface of the conductive film 201. The first mask layer may be made of silicon oxide or silicon oxynitride. The stiffness and pattern stability of the first mask layer may be higher than that of the first photoresist layer.

Because the conductive film 201 may be relatively thick, the etching duration of the conductive film 201 may be long. Thus, the first mask layer may be used to maintain the stability of the etched patterns, avoiding problems in the formed conductive layer 203, such as poor morphology and imprecise dimensions resulted from the dissolving of the first photoresist layer. In addition, the first mask layer may also be used to bond the first photoresist layer and the first anti-reflective layer together to prevent peeling off of the first photoresist layer The anisotropic dry etching process used to form the conductive layer 203 may use an etching gas made of hydrogen, a temperature ranging approximately from 10° C. to 40° C., a pressure ranging approximately from 5 mTorr to 100 mTorr, and an offset power ranging approximately from 100 W to 1000 W. In one embodiment, because the first barrier film 202 may be formed between the conductive film 201 and the substrate 200, after etching the conductive film 201, the etching process may be continued to etch the first barrier film 202 to form a first barrier layer 202*a*.

Further, the etching process may be performed below room temperature. Hydrogen plasma may be used to bombard the target to achieve etching. Because the dry etching process may use the hydrogen plasma to physically bombard the target, the etching speed difference between etching the first barrier film 202 and etching the conductive film 201 may be reduced. The formed first barrier layer 202*a* and the conductive layer 203 may have smooth sidewalls.

Figure 7:
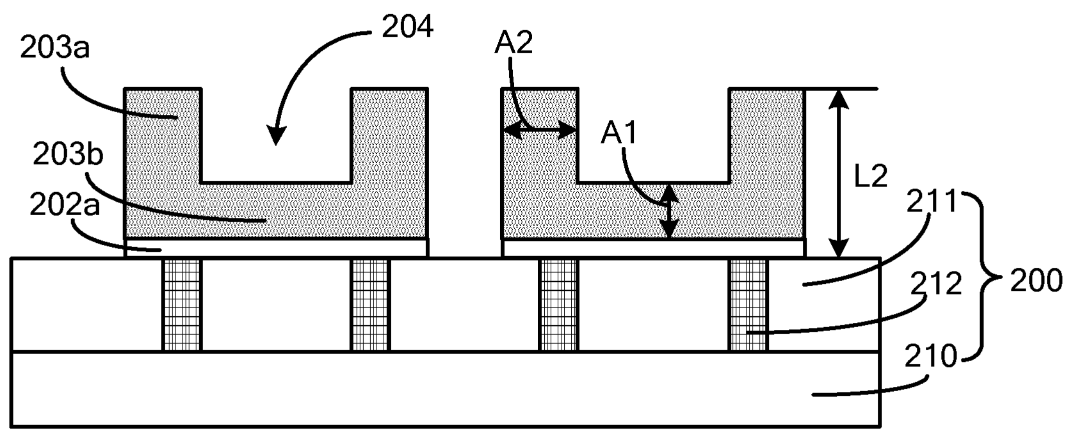

Returning to FIG. 11, portions of the conductive layers are etched to form trenches in the conductive layer (S105). FIG. 7 illustrates a sectional view of an exemplary electrical interconnection structure corresponding to certain stages of the fabrication process consistent with the disclosed embodiments.

As shown in FIG. 7, portion of the conductive layer 203 is etched, forming a trench 204 in the conductive layer 203. The depth of the trench 204 may be smaller than the first thickness H1 (FIG. 4). Portion of the conductive layer 203 located in the sidewalls of the trench 204 may serve as conductive vias 203*a*. Portion of the conductive layer 203 located under the conductive vias 203*a* and at the bottom of the trench 204 may serve as an electrical interconnection wire 203*b*. In addition, the dimension A1 of the electrical interconnection wire 203*b* along the direction perpendicular to the substrate 200 surface may be smaller than the second grain size L2. And, the dimension A2 of the conductive vias 203*a* along the direction parallel to the substrate 200 surface may be smaller than the second grain size L2.

Further, the conductive vias 203*a* and the electrical interconnection wire 203*b* may be formed by etching the conductive layer 203. That is, the conductive vias 203*a* and the electrical interconnection wire 203*b* may be formed together. Thus, the process for forming the conductive vias 203*a* and the electrical interconnection wire 203*b* may be simple. The electrical interconnection wire 203*b* may connect certain the first conductive layers 212 located in the first dielectric layer 211 together. In one embodiment, the electrical interconnection wire 203*b* connects two separated adjacent first conductive layers 212 together. The conductive vias 203*a* may be used to electrically connect the electrical interconnection wire 203*b* to other conductive structures or semiconductor devices formed subsequently on the surface of a second dielectric layer.

In one embodiment, the conductive layer 203 is formed by one copper grain. And, the copper grain may have the second lattice structure. One individual complete the second lattice structure may have the relatively large second grain size L2. During forming the conductive vias 203*a* and the electrical interconnecting wire 203*b*, the lattice structure of the material in the conductive layer 203 does not change and may still keep the second lattice structure arrangement. Thus, the material in the conductive layer 203 may still have good electrical performance.

Further, because the conductive vias 203*a* and the electrical interconnection wire 203*b* may be formed by etching the conductive layer 203, the dimension A1 of the electrical interconnection wire 203*b* along the direction perpendicular to the semiconductor substrate 200 surface and the dimension A2 of the conductive vias 203*a* along the direction parallel to the substrate 200 surface may all be smaller than the second grain size L2. That is, the formed conductive vias 203*a* and electrical interconnection wire 203*b* may be relatively small, and may be good for the semiconductor devices integration and minimization.

Moreover, at least one conductive vias 203*a* may be formed on the surface one same electrical interconnection wire 203*b*, and at least one trench 204 may be formed in the conductive layer 203. In one embodiment, one trench 204 is formed in the conductive layer 203, and two conductive vias 203*a* are formed on the surface of the electrical interconnection wire 203*b*. The cross section of the electrical interconnection wire 203*b* and the conductive vias 203*a* may form a "U" shape structure. In other embodiments, one or more parallel trenches may be formed in the conductive layer 203. And, the conductive layers located between adjacent trenches may be used as conductive vias 203*a*.

In addition, the etching process for forming the trench 204 may include forming a second mask on the conductive layer 203 to define the pattern of the to-be-formed conductive vias 203*a* along the direction parallel to the substrate 200 surface; performing an anisotropic drying etching process to etch the conductive layer 203 using the second mask as a mask, forming the trench 204 in the conductive layer 203; removing the second mask after forming the trench 204.

Further, the second mask may include a second anti-reflection layer on the conductive layer 203, a second mask layer on the second anti-reflection layer, and a second photoresist layer on the second mask layer. The second anti-reflection layer may be made of amorphous carbon or certain bottom anti-reflection materials. And, the second mask layer may be made of silicon oxide or silicon oxynitride.

The anisotropic dry etching process for forming the trench 204 may use an etching gas made of hydrogen, a process temperature ranging approximately from 10° C. to 40° C., a process pressure ranging approximately from 5 mTorr to 100 mTorr, and an offset power ranging approximately from 100 W to 1000 W.

Figure 8:
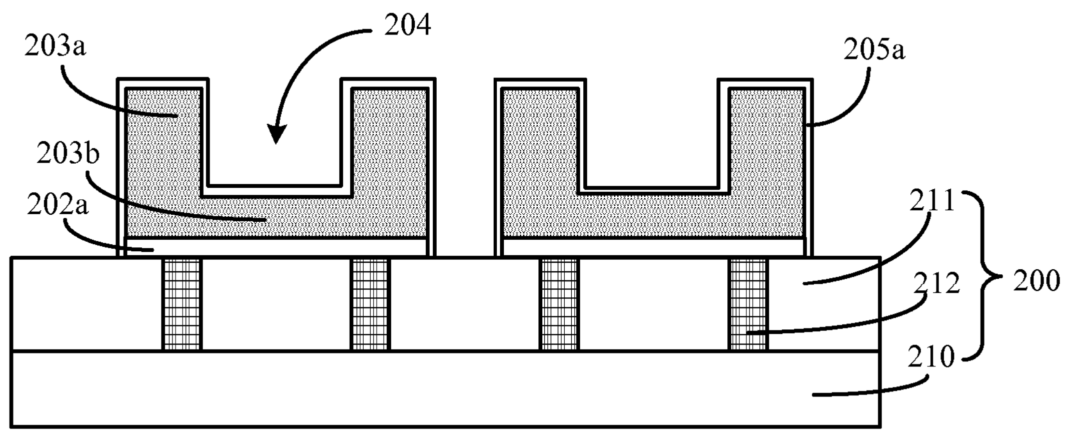

Returning to FIG. 11, a first barrier material layer is formed on the surface of the conductive layers and the trenches (S106). FIG. 8 illustrates a sectional view of an exemplary electrical interconnection structure corresponding to certain stages of the fabrication process consistent with the disclosed embodiments.

As shown in FIG. 8, a first barrier material layer 205*a* is formed on the surfaces of the sidewalls and the bottom of the conductive layer 203, and on the surfaces of the sidewalls and the bottom of the trench 204.

In one embodiment, the first barrier material layer 205*a* and a subsequently formed second barrier material layer may form a second barrier layer. The second barrier layer may prevent the conductive material in the conductive layer 203 from diffusing into a second dielectric layer formed later. In other embodiments, the second barrier layer may only include the first barrier material layer 205*a*, and the second barrier material layer may not be formed.

Further, the first barrier material layer 205*a* may be formed on the surfaces of the sidewalls and the bottom of the conductive layer 203, and on the surfaces of the sidewalls and the bottom of the trench 204 by a selective deposition process. The first barrier material layer 205*a* may be made of CoWP or Co. By using the selective deposition process, the first barrier material layer 205*a* may be formed only on surfaces of the conductive materials, not on the surface of the first dielectric layer 211. Thus, after performing the selective deposition process, an etching process to expose the first dielectric layer 211 may be avoided.

In one embodiment, the first barrier material layer 205*a* is made of the CoWP. And, the selective deposition process for forming the first barrier material layer 205*a* is the selective electroless plating process. The selective electroless plating process may use a deposition solution containing an oxidizing agent, a reducing agent, and an alkaline solution. Further, the PH value of the alkaline solution may range approximately from 8.9 to 9. The temperature of the electroless plating process may range from 20° C. to 90° C. When the first barrier material layer 205*a* is made of the CoWP, the oxidizing agent may include $H_3P(W_3O_{10})_4$ and $CoSO_4.6H_2O$, the reducing agent may include $NaH_2PO_2$ having a concentration ranging approximately from 0.23 mol/L to 0.25 mol/L, and the alkaline solution is KOH solution.

In other embodiments, the first barrier material layer 205*a* may be made of CuAl, CuSi, CuAlSi, or CuMn. And, the first barrier material layer 205*a* may be formed by a selective chemical vapor deposition process.

Returning to FIG. 11, a second barrier material layer is formed on sidewalls of the conductive layers and the trenches (S107). FIG. 9 illustrates sectional view of an exemplary electrical interconnection structure corresponding to certain stages of the fabrication process consistent with the disclosed embodiments.

As shown in FIG. 9, after forming the first barrier material layer 205*a*, a second barrier material layer 205*b* is formed on the surfaces of the sidewalls of the conductive layer 203 and the trench 204. The second barrier material layer 205*b* and the first barrier material layer 205*a* together may form a second barrier layer 205.

Because the blocking ability of the first barrier material layer 205*a* may be limited, in one embodiment, the second barrier material layer 205*b* may be formed to further prevent the material in the conductive layer 203 from diffusing outside.

The second barrier material layer 205*b* may be made of a combination of tantalum and tantalum nitride. The process for forming the second barrier layer material layer 205*b* may include deposing a barrier film on the surfaces of the substrate 200 and the conductive layer 203, and on sidewalls and the bottom of the trench 204; etching back the barrier film until the surface of the substrate 200 is exposed. Further, the deposition process for forming the barrier film may be a chemical vapor deposition process. And, the etching back process may be an anisotropic dry etching process. During removing the barrier film located on the surface of the first dielectric layer 211, portion of the barrier layer located on the bottom of the trench 204 and on the top surface of the conductive vias 203*a* may be removed as well. The first barrier material layer 205*a* may protect the bottom of the trench 204 and may protect the top portion of the conductive vias 203*a* during the etching back process.

In other embodiments, the second barrier material layer may be formed prior forming the first barrier material layer. The second barrier material layer formed on sidewalls of the conductive layer 203 and the trench 204 along may serve as the second barrier layer. The first barrier material layer may not be formed.

Returning to FIG. 11, a second dielectric layer is formed on the substrate, on sidewalls of the conductive layers, and in the trenches (S108). FIG. 10 illustrates a sectional view of an exemplary electrical interconnection structure corresponding to certain stages of the fabrication process consistent with the disclosed embodiments.

As shown in FIG. 10, a second dielectric layer 206 is formed on the surface of the substrate 200, on the surfaces of the sidewalls of the conductive layer 203, and in the trench 204 (FIG. 8).

The second dielectric layer 206 may be used to insulate the conductive vias 203*a* and the electrical interconnection wire 203*b*. The surface of the second dielectric layer 206 may be in flush with the top surface of the conductive vias 203*a*. During the subsequent process, certain conductive structures or semiconductor devices may be formed on the surface of the second dielectric layer 206. And, the formed conductive structures or semiconductor devices may be electrically connected to the conductive vias 203*a*.

Further, the second dielectric layer 206 may be made of $SiO_2$, SiN, SiON, SiCOH, or certain low k materials. In one embodiment, the second dielectric layer 206 is made of the low k materials having a dielectric constant smaller than 2.5.

When the second dielectric layer 206 is made of the low k materials, the electrical insulation between the electrical interconnection wires 203*b* and between the conductive vias 203*a* may be better.

Moreover, the process for forming the second dielectric layer 206 may include performing a deposition process to deposited materials on the surface of the substrate 200 and in the trench 204 to form a second dielectric film; and performing a chemical mechanical planarization process to polish the second dielectric film. The chemical mechanical planarization process may be continued until the top surface of the conductive vias 203*a* is exposed, forming the second dielectric layer 206.

In one embodiment, one or more gaps 207 may be formed in the second dielectric layer 206 located between adjacent electrical interconnection wires 203*b*. The gaps 207*a* may further reduce the dielectric constant of the second dielectric layer 206 and, thus, may further increase the electrical insulation performance of the dielectric layer 206. The second dielectric film may be formed by a plasma enhanced chemical vapor deposition (PECVD) process. By using the plasma enhanced chemical vapor deposition process, the second dielectric layer material may be deposited more on the surface of the sidewalls close to the top of the conductive layer 203, and may form the gaps 207*a* in the second dielectric film.

Further, the pattern size of the electrical interconnection wire 203*b* along the direction parallel to the substrate surface may be relatively large, and the distance between the adjacent electric interconnection wires 203*b* may be relatively small. The conductive vias 203*a* may be formed together with the etching of the conductive layer to form the trench 204 process. Thus, the adjacent conductive vias 203*a* may have a large gap between them. During the deposition process, the gaps 207 may be formed more easily between the adjacent electric interconnection wires 203*b*. The second dielectric film may fill the gaps between adjacent conductive vias 203*a* more easily as well.

The formed gaps 207 may be located at the bottom of the second dielectric layer 206. Thus, when performing certain fabrication processes later on the surface of the second dielectric layer 206, the gaps 207 located in the second dielectric layer 206 may be hard to be opened. Thereby, materials used in the subsequently processes may be hard to get into the gaps 207. The stability of the electrical interconnection structure may be enhanced.

According to the above analysis, the conductive film formed on the substrate may have the first grain size, and the thickness of the conductive film may be larger than the first grain size. Thus, gains of the material in the conductive film may have enough room to grow up. After the annealing process, the first grain size may be enlarged to the second grain size. Thereby, the formed conductive film may have significantly low resistance. The conductive vias and the electric interconnection wires formed using the conductive film may have good electrical performance.

Further, the conductive layer may be formed by etching the conductive film. Trenches may be formed in the conductive layer. Portion of the conductive layer located in the trenches sidewalls may be used as the conductive vias, and portion of the conductive layer located under the conductive vias and at the trenches bottom may be used as the electrical interconnection wires. That is, the conductive vias and the electrical interconnection wires may all be formed using the conductive film. Thus, processes for forming the conductive vias and the electrical interconnection wires may be performed together, simplifying the electrical interconnection structure fabrication process.

In addition, the conductive film may be used to form the electrical interconnection wires and the conductive vias on the surface of the electrical interconnection wires. The sum of the height of the conductive vias and the thickness of the electrical interconnection wires may be relatively larger, and the thickness of conductive film may be relatively larger. Thus, prior to forming the conductive layer, it may be unnecessary to thin the conductive film significantly. Thereby, the process for forming the electrical interconnection structure may be easily performed. The formed electrical interconnection structure may have desired morphology.

Another aspect of the present disclosure provides an electrical interconnection structure may formed by the above illustrated method.

As shown in FIG. 9, an exemplary electric interconnection structure consistent with the present disclosure may include a substrate 200; at least one conductive layer located on portion of the semiconductor substrate 200; one or more trenches (not shown) located in the conductive layer; and a second dielectric layer 206 located on the semiconductor substrate 200 and in the trench.

In addition, the conductive layer may have a first thickness. The material in the conductive layer may have a second grain size. Portion of the conductive layer located in the sidewalls of the trench may be used as conductive vias 203*a*, and portion of the conductive layer located under the conductive vias 203*a* and at the trenches bottom may be used as an electrical interconnection wire 203*b*. The trenches may have a depth less than the first thickness Further, the dimension of the electrical interconnection wire 203*b* along the direction perpendicular to the substrate 200 surface may be smaller than the second grain size. The dimension of the conductive plug 203*a* along the direction parallel to the substrate 200 surface may be smaller than the second grain size.

In one embodiment, the conductive layer may contain trenches. Portion of the conductive layer located in the trenches sidewalls may be used conductive vias, and portion of the conductive layer located under the conductive vias and at the bottom of the trenches may be used as electrical interconnection wires. The dimension of the electrical interconnection wires along the direction perpendicular to the substrate surface and the dimension of the conductive vias along the direction parallel to the substrate surface may be all smaller than the second grain size. That is, the second grain size may be relatively large. Thus, the conductive layer may have low resistance. The electrical interconnection structure made using the conductive layer may have desired performance.

Embodiments consistent with the current disclosure provide electrical interconnection structures and fabrication methods thereof. Other applications, advantages, alternations, modifications, or equivalents to the disclosed embodiments are obvious to those skilled in the art. It is intended that the specification and examples be considered as exemplary only, with a true scope and spirit of the invention being indicated by the claims.

What is claimed is:

1. An interconnection structure fabrication method, comprising:

providing a substrate;

forming a conductive film with a first thickness and having a first lattice structure and a first grain size, the first thickness being greater than the first grain size;

performing an annealing process to change the first lattice structure of the conductive film to a second lattice structure and to change the first grain size to a second grain size, the second grain size being greater than the first grain size and the first thickness being greater than or equal to the second grain size;

etching portion of the conductive film to form at least one conductive layer;

etching portion of the conductive layer to form at least one trench having a depth smaller than the first thickness in the conductive layer to form an electrical interconnection wire and conductive vias; and forming a dielectric layer covering the substrate, sidewalls of the conductive layer, and the trench;

wherein portions of the conductive layer located in the trench sidewalls form the conductive vias having a lateral dimension along a direction parallel to substrate surface smaller than the second grain size.

2. The method according to claim 1, before forming the conductive film, further including:

forming a first dielectric layer on the substrate, with one or more conductive structures formed in the first dielectric layer, wherein a top surface of the conductive structures is in flush with a surface of the first dielectric layer.

3. An interconnection structure fabrication method, comprising:

providing a substrate;

forming a conductive film with a first thickness and having a first lattice structure and a first grain size, the first thickness being greater than the first grain size;

performing an annealing process to change the first lattice structure of the conductive film to a second lattice structure and to change the first grain size to a second grain size, the second grain size being greater than the first grain size and the first thickness being greater than or equal to the second grain size;

etching portion of the conductive film to form at least one conductive layer;

etching portion of the conductive layer to form at least one trench having a depth smaller than the first thickness in the conductive layer to form an electrical interconnection wire and conductive vias; and forming a dielectric layer covering the substrate, sidewalls of the conductive layer, and the trench;

wherein portions of the conductive layer located in the trench sidewalls form the conductive vias having a lateral dimension along a direction parallel to substrate surface smaller than the second grain size; and wherein portion of the conductive layer located under the conductive vias and at a bottom of the trench forms the electrical interconnection wire having a vertical dimension along a direction perpendicular to the substrate surface smaller than the second grain size.

4. The method according to claim 1, wherein:

The conductive film is made of copper having a thickness larger than 2000 angstroms;

annealing temperature is in a range approximately from 200° C. to 450° C.; and annealing duration is in a range from approximately 5 minutes to 30 minutes.

5. The method according to claim 1, wherein the etching the conductive film further includes:

forming a first mask on the conductive film to define a pattern of the interconnection wire;

performing an anisotropic dry etching process to etch the conductive film using the first mask as a mask to form the conductive layer; and removing the first mask after forming the conductive layer.

6. The method according to claim 5, wherein the first mask further includes:

a first anti reflection layer formed on the conductive film;

a first mask layer formed on the first anti-reflection layer; and a first photoresist layer formed on the first mask layer.

7. The method according to claim 6, wherein:

the first anti-reflection layer is made of amorphous carbon or bottom anti-reflection materials; and the first mask layer is made of silicon oxide or silicon oxynitride.

8. The method according to claim 1, wherein the etching portion of the conductive layer further includes:

forming a second mask on the conductive layer to define patterns of the conductive vias;

performing an anisotropic dry etching process to etch the conductive layer using the second mask as a mask to form the trench in the conductive layer; and removing the second mask after forming the trench.

9. The method according to claim 8, wherein the second mask further includes:

an anti-reflection layer formed on the conductive layer;

a mask layer formed on the anti-reflection layer; and a photoresist layer formed on the mask layer.

10. The method according to claim 9, wherein:

the anti-reflection layer is made of amorphous carbon or bottom anti-reflection materials; and the mask layer is made of silicon oxide or silicon oxynitride.

11. The method according to claim 5, wherein the etching the conductive film further includes:

performing an anisotropic dry etching process using:

an etching gas made of hydrogen;

a temperature ranging approximately from 10° C. to 40° C., a pressure ranging approximately from 5 mTorr to 100 mTorr, and an offset power ranging approximately from 100 W to 1000 W.

12. The method according to claim 1, wherein:

the conductive layer is made of one material grain.

13. The method according to claim 1, wherein:

after the annealing process, the conductive film is thinned to have a second thickness less than or equal to the second grain size.

14. The method according to claim 1, wherein:

a first barrier layer made of tantalum, tantalum nitride, lanthanum, copper-manganese alloy, or cobalt is formed on the substrate prior to forming the conductive film; and the conductive film is formed on the first barrier layer.

15. The method according to claim 1, wherein:

a second barrier layer is formed on surfaces of sidewalls of the conductive layer and on surfaces of the trench after forming the trench.

16. The method according to claim 15, wherein the second barrier layer further includes:

a first barrier material layer made of CoWP or Co formed on surfaces of sidewalls and of the conductive layer and on bottom of the trench by a selective deposition process; and a second barrier material layer made of tantalum and tantalum nitride composite formed on the surfaces of sidewalls of the conductive layer and the trench.

17. The method according to claim 15, wherein the second barrier material layer is formed by:

depositing a barrier film on the surfaces of the substrate and the conductive layer, on sidewalls and bottom of the trench; and etching backing the barrier film until the surface of the substrate is exposed to form the second barrier material layer.

18. The method according to claim 1, wherein:

the dielectric layer is made of low k dielectric materials having a dielectric constant smaller than 2.5; and one or more gaps are formed in the second dielectric layer located between adjacent electrical interconnection wires.

* * * * *